United States Patent
Hiratsuka et al.

(10) Patent No.: US 10,172,264 B2
(45) Date of Patent: Jan. 1, 2019

(54) HOUSING AND ELECTRONIC DEVICE

(71) Applicant: FUJITSU LIMITED, Kawasaki-shi, Kanagawa (JP)

(72) Inventors: Yoshiaki Hiratsuka, Ota (JP); Kai Nojima, Yokohama (JP); Kenji Nagase, Yokohama (JP); Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 5 days.

(21) Appl. No.: 15/642,892

(22) Filed: Jul. 6, 2017

(65) Prior Publication Data

US 2018/0027707 A1 Jan. 25, 2018

(30) Foreign Application Priority Data

Jul. 21, 2016 (JP) .................. 2016-142988

(51) Int. Cl.
*H05K 5/00* (2006.01)
*H05K 5/03* (2006.01)
*H05K 9/00* (2006.01)

(52) U.S. Cl.
CPC ......... *H05K 9/0049* (2013.01); *H05K 5/0008* (2013.01); *H05K 5/03* (2013.01)

(58) Field of Classification Search
CPC ....... H05K 9/0049; H05K 5/0008; H05K 5/03
See application file for complete search history.

(56) References Cited

U.S. PATENT DOCUMENTS

2018/0155184 A1* 6/2018 Gudeman ............. B81B 3/0024

FOREIGN PATENT DOCUMENTS

| JP | 1-270399 | 10/1989 |
| JP | 2007-67195 | 3/2007 |

* cited by examiner

*Primary Examiner* — Robert J Pascal
*Assistant Examiner* — Kimberly E Glenn
(74) *Attorney, Agent, or Firm* — Staas & Halsey LLP

(57) ABSTRACT

A housing includes a first member that has a first conductor, a second member that has a second conductor and cooperates with the first member to accommodate a circuit board on which an electronic element is mounted, inside a space surrounded by the first conductor and the second conductor, and a plurality of connecting elements that are arranged at a predetermined arrangement interval y to fix the second member to the first member.

6 Claims, 8 Drawing Sheets

HOUSING AND ELECTRONIC DEVICE

CROSS-REFERENCE TO RELATED APPLICATION

This application is based upon and claims the benefit of priority of the prior Japanese Patent Application No. 2016-142988, filed on Jul. 21, 2016, the entire contents of which are incorporated herein by reference.

FIELD

The embodiments discussed herein are related to a housing and an electronic device for which measures for Electro Magnetic Compatibility (EMC) are taken.

BACKGROUND

With the development of electronic devices, problems have arisen, for example, in that electromagnetic noise emitted from an electronic device causes a failure in other electronic devices, or an electronic device malfunctions due to electromagnetic noise emitted from other electronic devices. Thus, there has been a demand for EMC measures in a process of designing and assembling an electronic device.

Since the electromagnetic noise is blocked by a metal, it may be conceived to hermetically seal an electronic circuit which is a source of generating the electromagnetic noise, for example, within a housing made of a metal. As an example, it may be conceived to install flanges on two metal members (a housing body and a lid) forming a housing, respectively, and overlap and fix the flanges by screws, caulking, rivets, welding or the like (hereinafter, referred to as "connecting elements").

When the two metal members having the flanges are fixed by the connecting elements such as screws, an attenuation amount of the electromagnetic noise is relative to the widths of the flanges and the arrangement interval (pitch) of the connecting elements. For example, when a frequency is 1,000 MHz, and the arrangement interval of the connecting elements is 7.5 cm, the width of each flange which is required to reduce the electromagnetic noise by 15 dB is about 5 cm.

However, in an electronic device such as a computer, when the flanges each having the width of 5 cm are installed, the size of the electronic device increases, and furthermore, a problem is also caused in view of design.

The following is a reference document.
[Document 1] Japanese Laid-Open Patent Publication No. 2007-067195.

SUMMARY

According to an aspect of the invention, a housing includes a first member that has a first conductor, a second member that has a second conductor and cooperates with the first member to accommodate a circuit board on which an electronic element is mounted, inside a space surrounded by the first conductor and the second conductor, and a plurality of connecting elements that are arranged at a predetermined arrangement interval y to fix the second member to the first member, wherein, when an overlapping width between the first conductor and the second conductor is x, a frequency of a clock signal flowing through the circuit board is f, a speed of light is c, and a wavelength of electromagnetic noise is $\lambda=c/f$, a value of the arrangement interval y is calculated by following equation (1) or (2), $$\text{when } x \leq 2.2 \text{ mm}, y \leq (0.13x+0.0015)\lambda \qquad (1)$$

$$\text{when } x > 2.2 \text{ mm}, y = (10^{-5}x^3 - 0.0006x^2 + 0.012x + 0.25)\lambda \qquad (2).$$

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described with reference to the accompanying drawings.

Figure 1:
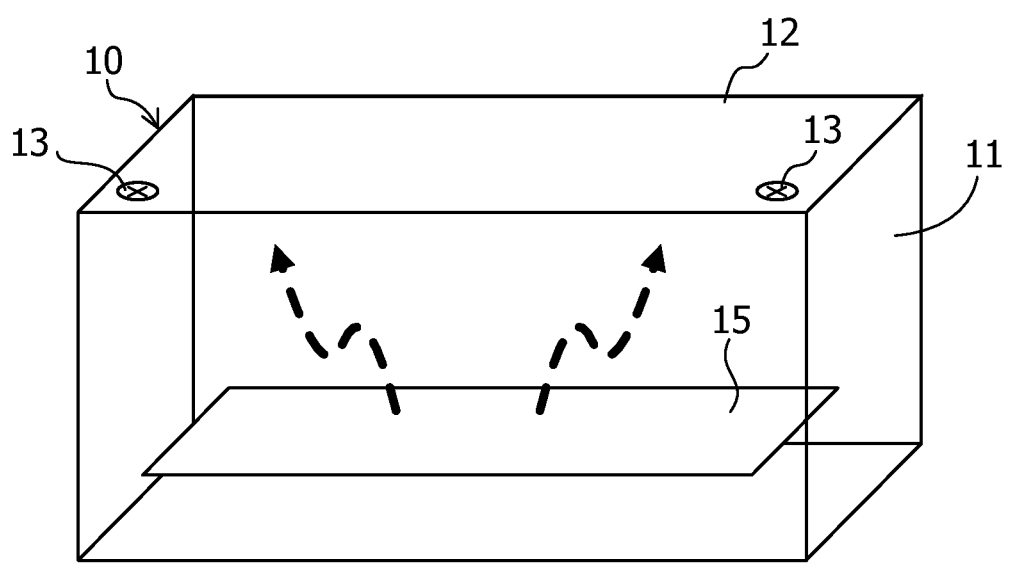
FIG. 1 is a perspective view schematically illustrating an example of an electronic device.

FIG. 1 is a perspective view schematically illustrating an example of an electronic device.

In the electronic device illustrated in FIG. 1, a housing 10 accommodates a circuit board 15 on which a central processing unit (CPU) and other electronic components are mounted. The housing 10 includes a housing body (a first member) 11 and a flat plate shaped lid (a second member) 12 disposed on the housing 11. The housing body 11 is formed by a rectangular bottom plate and four side plates surrounding the bottom plate. The lid 12 is fixed to the housing body 11 by screws 13 (or other connecting elements (the same shall apply hereinafter)).

The surfaces (the inner surfaces, the outer surfaces, and the edge surfaces) of the housing body 11 and the lid 12 are conductive, and the circuit board 15 is sealed in the space surrounded by the conductors. Accordingly, leakage of the electromagnetic noise from the circuit board 15 to the outside of the housing body 11 or entry of the electromagnetic noise from the outside into the housing 10 is suppressed.

Figure 2:
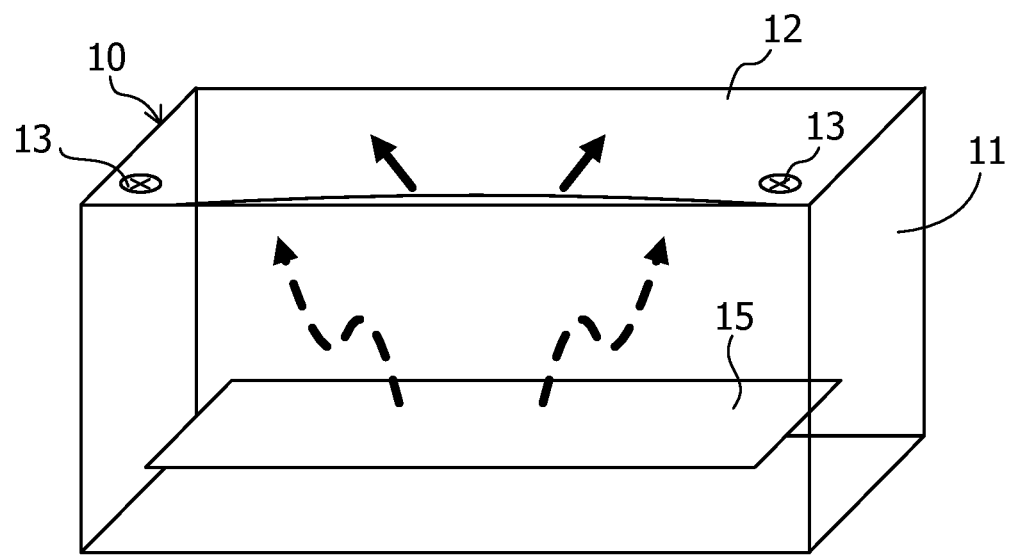
FIG. 2 is a perspective view schematically illustrating a housing in which a portion where close contact between a housing and a lid is insufficient occurs between screws.

However, when the edge of the lid 12 and the hosing body 11 are thoroughly in close contact with each other as illustrated in FIG. 1, the electromagnetic noise may be blocked by the housing body 11. However, actually, a portion where the close contact between the housing body 11 and the lid 12 is insufficient occurs between the adjacent screws 13 as illustrated in FIG. 2, and the electromagnetic noise leaks from the portion.

In order to avoid the leakage of the electromagnetic noise between the housing body 11 and the lid 12, a related technology has installed flanges each having a width determined depending on the arrangement interval of the screws 13 and the frequency of the electromagnetic noise, on the housing body 11 and the lid 12, respectively. In that case, when the frequency of electromagnetic waves is 1,000 MHz, and the arrangement interval of the screws (the connecting elements) is 7.5 cm, the width of each of the flanges becomes 5 cm.

The inventors of the present disclosure inspected the intensity of the electromagnetic noise generated from the circuit board on which electronic components such as the CPU are mounted.

Figure 3:
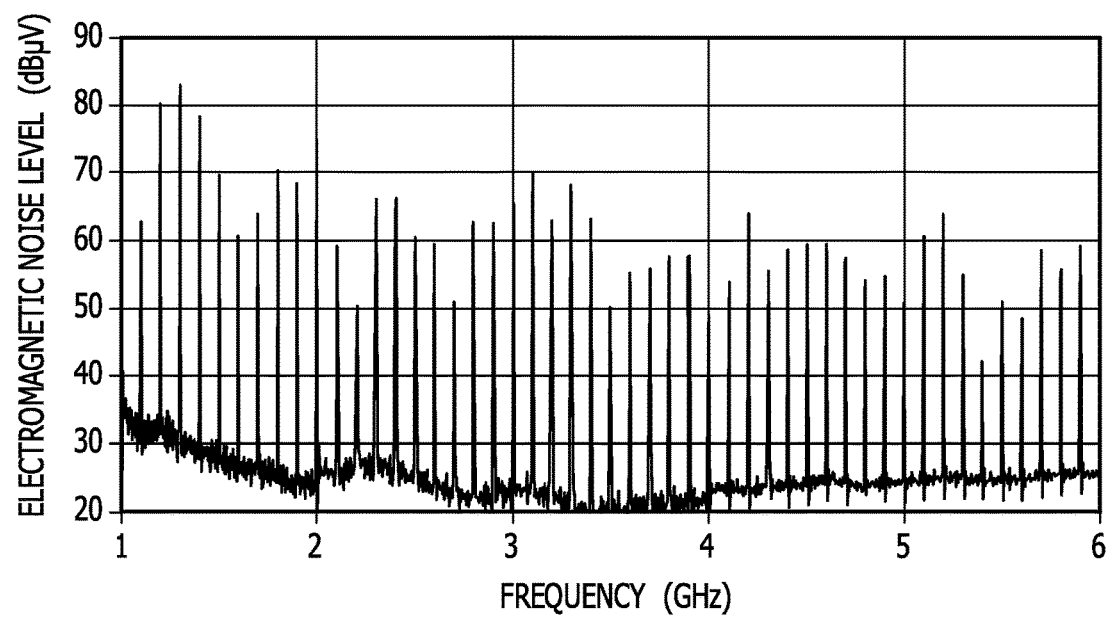
FIG. 3 is a view illustrating a result obtained from the inspection of the intensity of electromagnetic noise generated from a circuit board.

FIG. 3 is a view illustrating a result obtained from the inspection of the intensity of the electromagnetic noise generated from the circuit board, with the horizontal axis representing a frequency of a clock signal and the vertical axis representing a level of the electromagnetic noise.

As may be seen from FIG. 3, the electromagnetic noise of about 80 dBμV is generated from the circuit board. Meanwhile, although the regulation level of the electromagnetic noise differs depending on countries, the regulation level is approximately 50 dBμV. Thus, in the housing, the electromagnetic noise generated from the circuit board needs to be suppressed by 30 dB.

The inventors of the present disclosure variously changed the overlapping width x of the two members (the housing body and the lid) forming the housing and the arrangement interval y of the screws, and inspected the attenuation amount of the electromagnetic noise under each of the conditions. Here, the overlapping width x is the width of the portion where the conductors of the two respective members are in contact with each other.

Figure 4:
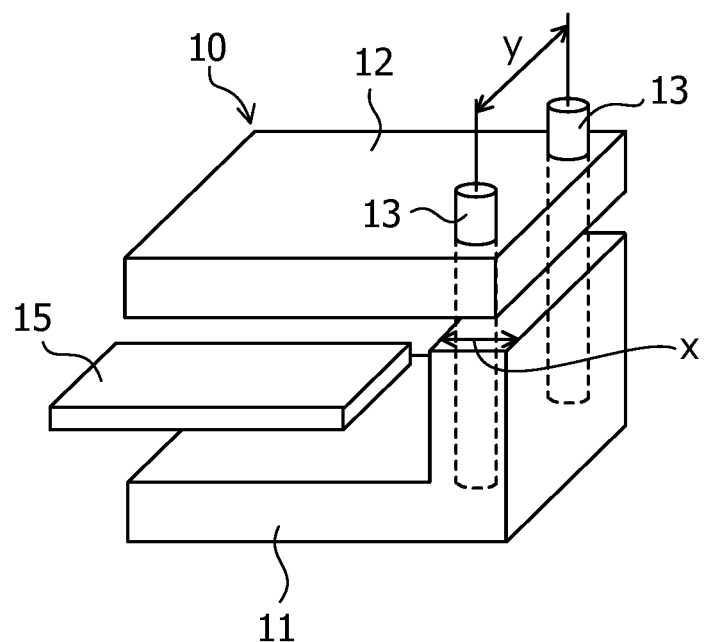
FIG. 4 is a view schematically illustrating a part of the housing.

FIG. 4 is a view schematically illustrating a part of the housing 10. Here, as illustrated in FIG. 4, it is assumed that the circuit board 15 which is a source of generating the electromagnetic noise is disposed inside the housing 10 formed by the housing body 11 and the lid 12 which are made of a metal. Further, it is assumed that the overlapping width between the side walls of the housing body 11 and the lid 12 is x, and the distance (the arrangement interval) between the adjacent screws 13 is y.

In addition, while a method of a related technology inspects the attenuation amount of the electromagnetic noise by using a sinusoidal signal, the inventors of the present disclosure inspect the attenuation amount of the electromagnetic noise by using a clock signal (a pulse shaped rectangular wave signal) flowing through the circuit board 15. This is because the electromagnetic noise generated from an electronic device such as a computer is mainly caused by a clock signal flowing through the circuit board 15. For the analysis of the attenuation amount of the electromagnetic noise, the electromagnetic field analysis software (Poynting for Microwave™) of Fujitsu Limited was used.

Figure 5:
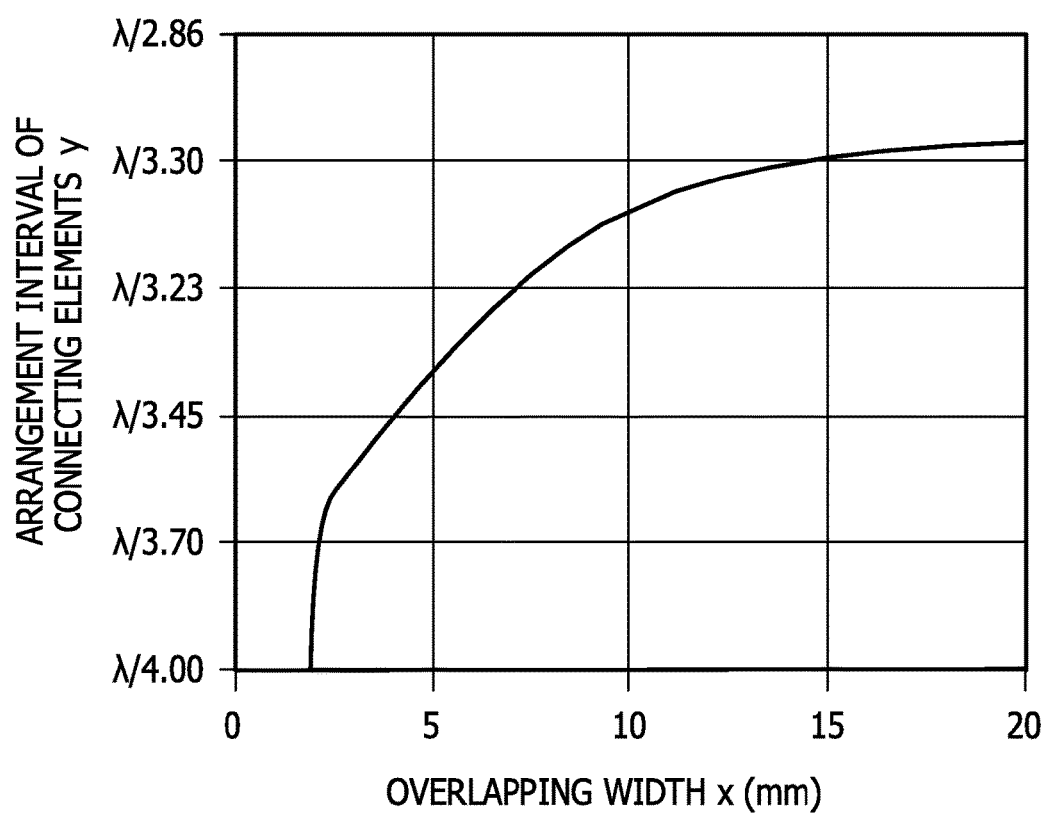
FIG. 5 is a graph obtained by connecting points where an attenuation amount is 30 dB.

As a result, the relationship between the overlapping width x of the two members (the housing body and the lid) forming the housing and the arrangement interval y of the screws when the attenuation amount is set to 30 dB became as illustrated in FIG. 5. In addition, λ in FIG. 5 is the wavelength (unit: mm) of the electromagnetic noise, and λ=c/f (c is the speed of light, and f is the frequency of the clock signal).

FIG. 5 is a graph obtained by connecting points where the attenuation amount is 30 dB, with the horizontal axis representing the overlapping width x and the vertical axis representing the arrangement interval y of the screws. When the relationship between the overlapping width x of the housing body 11 and the lid 12 and the arrangement interval y of the screws 13 is lower than the curve illustrated in FIG. 5, the electromagnetic noise leaking to the outside of the housing 10 is reduced by 30 dB to become 50 dBμV or less.

Figure 6:
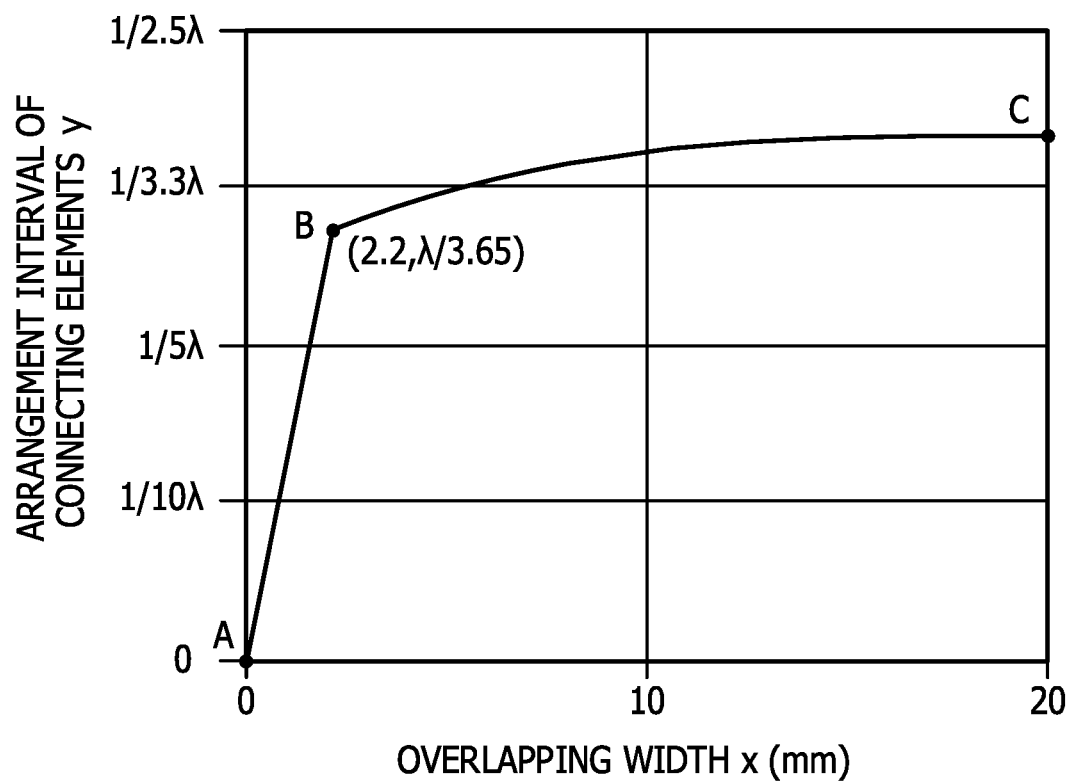
FIG. 6 is a view divisionally illustrating a portion obtained by straight line approximation of the curve illustrated in FIG. 5 and a portion obtained by curve approximation of the curve illustrated in FIG. 5.

The inventors of the present disclosure divided the curve illustrated in FIG. 5 into a straight line approximation portion (between A and B) and a curve approximation portion (between B and C) as illustrated in FIG. 6, and represented the portions with the following equations (1) and (2), respectively. Here, an X coordinate value (the overlapping width x) of the point B is 2.2 mm, and a Y coordinate value (the arrangement interval y of the connecting elements) thereof is λ/3.65.

$$y=(0.13x+0.0015)\lambda \quad (1)$$

$$y=(10^{-5}x^3-0.0006x^2+0.012x+0.25)\lambda \quad (2)$$

According to FIG. 6, it may be understood that when the frequency of the clock signal is 1,000 MHz, and the arrangement interval y of the screws 13 is λ/4 (=7.5 cm), the overlapping width x between the housing body 11 and the lid 12 is 2 mm. In other words, when the overlapping width between the housing body 11 and the lid 12 is 2 mm or more, the arrangement interval of the screws 13 may be λ/4 or more.

In addition, equations (1) and (2) are represented as the following equations (1)' and (2)' when the number of significant digits is expanded.

$$y=(0.1285x+0.0015)\lambda \quad (1)'$$

$$y=(10^{-5}x^3-0.0006x^2+0.0123x+0.2498)\lambda \quad (2)'$$

Instead of equation (1) or (2) above, the equation (1)' or (2)' may be used.

Figure 7A:
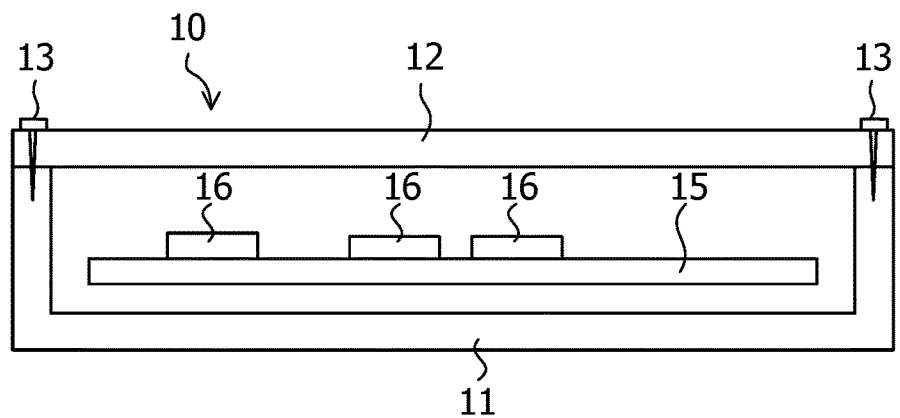
FIG. 7A is a cross-sectional view illustrating an electronic device according to an embodiment.
Figure 7B:
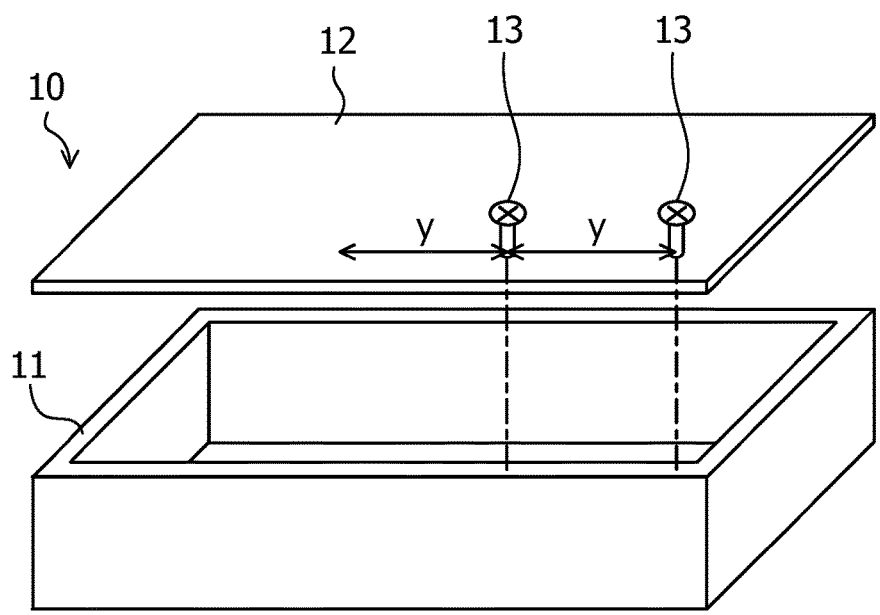
FIG. 7B is a perspective view illustrating a casing of the same electronic device.

FIG. 7A is a cross-sectional view illustrating an electronic device according to the present embodiment, and FIG. 7B is a perspective view illustrating a housing of the electronic device.

The circuit board 15 is accommodated inside the housing 10. The CPU and other electronic components 16 are mounted on the circuit board 15, and a clock signal of 1,000 MHz flows through the circuit board 15.

The housing 10 includes the housing body 11 and the lid 12. Here, it is assumed that the housing body 11 and the lid 12 are made of a resin, and the surfaces (the inner surfaces, the outer surfaces, and the edge surfaces) thereof are covered with a conductor such as a metal. However, both the housing body 11 and the lid 12 may be formed of a metal.

The overlapping width x (see, e.g., FIG. 4) between the housing body 11 and the lid 12 is 2 mm. In addition, the lid 12 is fixed to the housing body 11 by the screws 13. Further, the arrangement interval y of the screws 12 is set to 7.5 cm.

In the electronic device according to the present embodiment, since the circuit board 15 which is a source of generating the electromagnetic noise is disposed inside the housing 10 as an EMC measure, the electromagnetic noise leaking to the outside of the housing 10 is reduced to 50 dBμV or less. Further, in the electronic device according to the present embodiment, since the overlapping width between the housing body 11 and the lid 12 is as small as 2 mm, and flanges protruding outwardly are unnecessary, the electronic device is small in size and excellent in design.

Figure 8A:
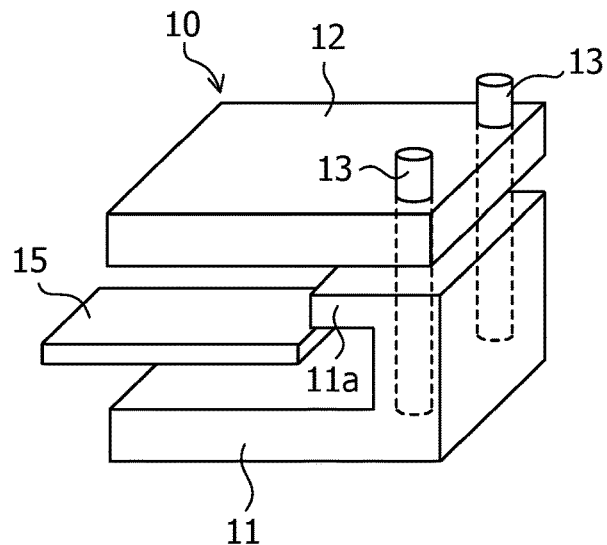
FIGS. 8A to 8C are schematic views illustrating examples of overlapping portions between the housing and the lid.
Figure 8B:
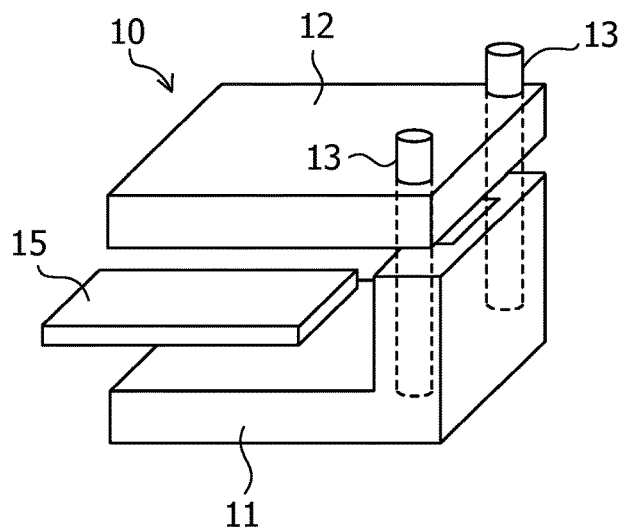
Figure 8C:
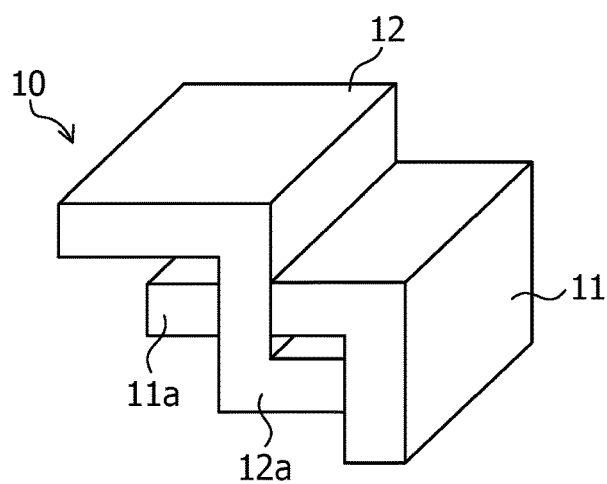

FIGS. 8A to 8C are schematic views illustrating an example of the overlapping portion between the housing body 11 and the lid 12.

FIG. 8A illustrates an example in which a flange 11a is formed to extend toward the inner side of the housing body 11, as a case where the overlapping width x between the housing body 11 and the lid 12 which is calculated from the formula (1) or (2) is larger than the thickness of the side wall.

FIG. 8B illustrates a case where the overlapping width x between the housing body 11 and the lid 12 which is calculated by the formula (1) or (2) is smaller than the thickness of the side wall. In this case, the thickness of the portion of the side wall of the housing body 11 where each of the screws 13 is disposed is set as the thickness required to fix the screws 13, and the thickness of the other portion is set as the overlapping width x between the housing body 11 and the lid 12 which is calculated by the formula (1) or (2).

FIG. 8C illustrates an example in which a slit is formed on the flange 11a of the housing body 11, and a crank shaped portion is formed in the lid 12 so as to be inserted into the slit as a connecting portion 12a.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A housing comprising:
    a first member that has a first conductor;
    a second member that has a second conductor and cooperates with the first member to accommodate a circuit board on which an electronic element is mounted, inside a space surrounded by the first conductor and the second conductor; and
    a plurality of connecting elements that are arranged at a predetermined arrangement interval y to fix the second member to the first member,
    wherein, when an overlapping width between the first conductor and the second conductor is x, a frequency of a clock signal flowing through the circuit board is f, a speed of light is c, and a wavelength of electromagnetic noise is $\lambda = c/f$, a value of the arrangement interval y is calculated by following equation (1) or (2), when $x \leq 2.2$ mm, $y \leq (0.13x+0.0015)\lambda$ (1)

when $x > 2.2$ mm, $y = (10^{-5}x^3 - 0.0006x^2 + 0.012x + 0.25)\lambda$ (2).

2. The housing according to claim 1, wherein the first member has a box shape, and the second member has a flat plate shape.

3. The housing according to claim 1, wherein the determined arrangement interval y is $\lambda/4$ or more.

4. The housing according to claim 1, wherein the connecting element is any one of a screw, caulking, a rivet, and welding.

5. The housing according to claim 1, wherein equations (1) and (2) are represented as follows when a number of significant digits of a coefficient is expanded, when $x \leq 2.2$ mm, $y \leq (0.1285x+0.0015)\lambda$ (1)

when $x > 2.2$ mm, $y \leq (10^{-5}x^3 - 0.0006x^2 + 0.0123x + 0.2498)\lambda$ (2).

6. A housing comprising:
    a first member that has a first conductor;
    a second member that has a second conductor and cooperates with the first member to accommodate a circuit board on which an electronic element is mounted, inside a space surrounded by the first conductor and the second conductor; and
    a plurality of connecting elements that are arranged at a predetermined arrangement interval y to fix the second member to the first member,
    wherein, when an overlapping width between the first conductor and the second conductor is x, a frequency of a clock signal flowing through the circuit board is f, a speed of light is c, and a wavelength of electromagnetic noise is $\lambda = c/f$, a value of the arrangement interval y is calculated by following equation (1) or (2), when $x \leq 2.2$ mm, $y \leq (0.13x+0.0015)\lambda$ (1)

when $x > 2.2$ mm, $y \leq (10^{-5}x^3 - 0.0006x^2 + 0.012x + 0.25)\lambda$ (2).

* * * * *